United States Patent
Torvik et al.

(10) Patent No.: US 6,870,204 B2
(45) Date of Patent: Mar. 22, 2005

(54) HETEROJUNCTION BIPOLAR TRANSISTOR CONTAINING AT LEAST ONE SILICON CARBIDE LAYER

(75) Inventors: John Tarje Torvik, Louisville, CO (US); Jacques Isaac Pankove, Boulder, CO (US)

(73) Assignee: Astralux, Inc., Boulder, CO (US)

( * ) Notice: Subject to any disclaimer, the term of this patent is extended or adjusted under 35 U.S.C. 154(b) by 0 days.

(21) Appl. No.: 10/301,261

(22) Filed: Nov. 21, 2002

(65) Prior Publication Data

US 2003/0094672 A1 May 22, 2003

Related U.S. Application Data

(60) Provisional application No. 60/333,258, filed on Nov. 21, 2001.

(51) Int. Cl.[7] .......................................... H01L 31/0328
(52) U.S. Cl. ......................... 257/197; 257/77; 257/198
(58) Field of Search ........................... 257/77, 197, 198

(56) References Cited

U.S. PATENT DOCUMENTS

| | | | |
|---|---|---|---|
| 2,524,033 A | 10/1950 | Bardeen | 179/171 |
| 2,569,347 A | 9/1951 | Shockley | 332/52 |
| 2,918,396 A | 12/1959 | Hall | 148/1.5 |
| 4,945,394 A * | 7/1990 | Palmour et al. | 257/77 |
| 4,985,742 A | 1/1991 | Pankove | 357/34 |
| 5,047,365 A * | 9/1991 | Kawanaka et al. | 438/315 |
| 5,272,096 A * | 12/1993 | de Fresart et al. | 438/312 |
| 5,350,699 A * | 9/1994 | Nii | 438/312 |
| 5,378,901 A * | 1/1995 | Nii | 257/77 |
| 5,378,921 A * | 1/1995 | Ueda | 257/574 |
| 5,441,911 A * | 8/1995 | Malhi | 438/285 |
| 5,557,118 A * | 9/1996 | Hashimoto | 257/197 |
| 5,610,411 A | 3/1997 | Takasu | 257/77 |
| 5,656,514 A * | 8/1997 | Ahlgren et al. | 438/320 |
| 5,864,169 A * | 1/1999 | Shimura et al. | 257/587 |
| 5,923,058 A * | 7/1999 | Agarwal et al. | 257/198 |
| 6,049,098 A * | 4/2000 | Sato | 257/198 |
| 6,313,488 B1 * | 11/2001 | Bakowski et al. | 257/198 |
| 6,329,675 B2 | 12/2001 | Singh et al. | 257/77 |
| 6,750,484 B2 * | 6/2004 | Lippert et al. | 257/198 |
| 2003/0071281 A1 * | 4/2003 | Lippert et al. | 257/200 |

FOREIGN PATENT DOCUMENTS

| | | | | |
|---|---|---|---|---|
| JP | 2-3931 | * | 1/1990 | 438/365 |
| JP | 3-104123 | * | 5/1991 | 257/197 |
| JP | 03104123 A | * | 5/1991 | H01L/21/331 |
| JP | 5-235016 | * | 9/1993 | 438/694 |
| JP | 5-267321 | * | 10/1993 | H01L/21/331 |

OTHER PUBLICATIONS

Integrated Pressure Sensor Using Silicon and Germanium Bipolar Transistors, Apr. 1, 1991, IBM Technical Disclosure Bulletin NN9104456, pp. 456–457.*

* cited by examiner

*Primary Examiner*—George Eckert
(74) *Attorney, Agent, or Firm*—Sheridan Ross P.C.

(57) ABSTRACT

A bipolar transistor includes a collector that is selected from the group SiC and SiC polytypes (4H, 6H, 15R, 3C . . . ), a base that is selected from the group Si, Ge and SiGe, at least a first emitter that is selected from the group Si, SiGe, SiC, amorphous-Si, amorphous-SiC and diamond-like carbon, and at least a second emitter that is selected from the group Si, SiGe, SiC, amorphous-Si, amorphous-SiC and diamond-like carbon. Direct-wafer-bonding is used to assemble the bipolar transistor. In an embodiment the bandgap of the collector, the bandgap of the at least a first emitter and the bandgap of the at least a second emitter are larger than the bandgap of the base.

44 Claims, 1 Drawing Sheet

HETEROJUNCTION BIPOLAR TRANSISTOR CONTAINING AT LEAST ONE SILICON CARBIDE LAYER

RELATED PATENT APPLICATIONS

This application claims the priority of U.S. Provisional Patent Application Ser. No. 60/333,258, filed on Nov. 21, 2001, entitled BIPOLAR TRANSISTOR CONTAINING AT LEAST ONE SILICON CARBIDE LAYER, assigned to Astralux, Inc., incorporated herein by reference.

Non-provisional U.S. patent application Ser. No. 10/273,041, filed Oct. 10, 2002, entitled DOUBLE HETEROJUNCTION LIGHT EMITTING DIODES AND LASER DIODES HAVING QUANTUM DOT SILICON CARBIDE EMITTERS, assigned to Astralux, Inc., incorporated herein by reference, provides for the fabrication of silicon-based light emitting diodes using nano-patterning and direct-wafer-bonding.

FIELD OF THE INVENTION

This invention relates to the field of active solid-state devices, and more specifically to bipolar transistors, also called semiconductor triodes, that include silicon carbide (SiC).

BACKGROUND OF THE INVENTION

Bipolar junction transistors (BJTs) are thought to have been invented in about 1948, for example see U.S. Pat. Nos. 2,524,033 and 2,569,347, incorporated herein by reference, wherein the use of semiconductors such as SiC was mentioned. In addition U.S. Pat. Nos. 2,918,396, 4,945,394, 5,610,411 and 6,329,675, incorporated herein by reference, are examples of patents that use SiC in BJTs.

A number of different semiconductor-device structures have been published and/or commercially developed. Heterojunction bipolar transistors (HBTs) (see above-mentioned U.S. Pat. No. 2,569,347) were made using a variety of different semiconductors in the same device structure. For example U.S. Pat. No. 4,985,742 by J. Pankove describes a GaN/SiC HBT, incorporated herein by reference.

In accordance with the present invention, direct-wafer-bonding (for example see Appl. Phys. Lett. 56, p.737, 1990, by Z. L. Liau and D. E. Mull) provides an elegant and cost effective alternative for forming wide-bandgap heterojunctions, wherein direct-wafer-bonding is performed using commercially available wafers and standard device processing.

Wafer-bonding of dissimilar semiconductors is a technology that has facilitated the manufacture of red AlInGaP/GaP light emitting diodes (LEDs) (see Appl. Phys. Lett. 56, p. 737, 1990, by Z. L. Liau and D. E. Mull), mirror stacks for long-wavelength VCSELs (see IEEE Photon. Technol. Lett. 7, 1225, 1995, by D. I. Babic et al), and Si/InGaAs p-i-n photodetectors (see Appl. Phys. Lett. 70, 2449, 1997, by B. F. Levine et al) with near-perfect interfaces, wherein the above-mentioned AlInGaP LEDs are manufactured using a high-volume production process, resulting in low cost products.

SUMMARY OF THE INVENTION

This invention provides new and unusual HBT structures that contain at least one SiC layer.

In accordance with a feature of this invention, the fabrication of HBTs having one or more heterojunctions utilizes a direct-wafer-bonding process by combining semiconductor materials that have incompatible growth technologies.

Active solid-state devices in accordance with the present invention find utility in a number of fields, including, but not limited to, RF power amplifiers used in wireless communication and radar applications, and power switches that are needed for traction control in electric vehicles. Direct-wafer-bonded bipolar transistors in accordance with this invention can be used as RF power devices and near-DC power switches. Direct-wafer-bonded heterojunctions in accordance with the invention can also be used in thyristors and heterojunction field-effect-transistors (HFETs).

SiC is a wide-bandgap semiconductor material that has extraordinary properties, for example high thermal conductivity, high breakdown field, and high saturated electron velocity. SiC can be made with either n-type conductivity or p-type conductivity, and various p-n diodes and n-p-n BJTs have been demonstrated. (For example see (1) Tang Y., Fedison J. B., and Chow T. P., An Implanted-Emitter 4H—SiC Bipolar Transistor with High Current Gain, El. Dev. Lett., Vol. 22, No. 3, pp119–120, 2001; and (2) Ryu S. H., Agarwal A. K., Singh R., and Palmour J., 1800V NPN Bipolar Junction Transistors in 4H—SiC, El. Dev. Lett., Vol. 22, No. 3, pp 124–126, 2001.)

However, SiC-based HBTs are not known to have been demonstrated prior to the present invention due to problems such as SiC bandgap engineering related to the binary nature of SiC, and due to the difficulty of growing different SiC polytypes together.

This invention provides discrete SiC bandgap engineering using a direct-wafer-bonding process, which process achieves the combination of SiC and Si for bipolar solid-state device applications.

DETAILED DESCRIPTION

Figure 1:
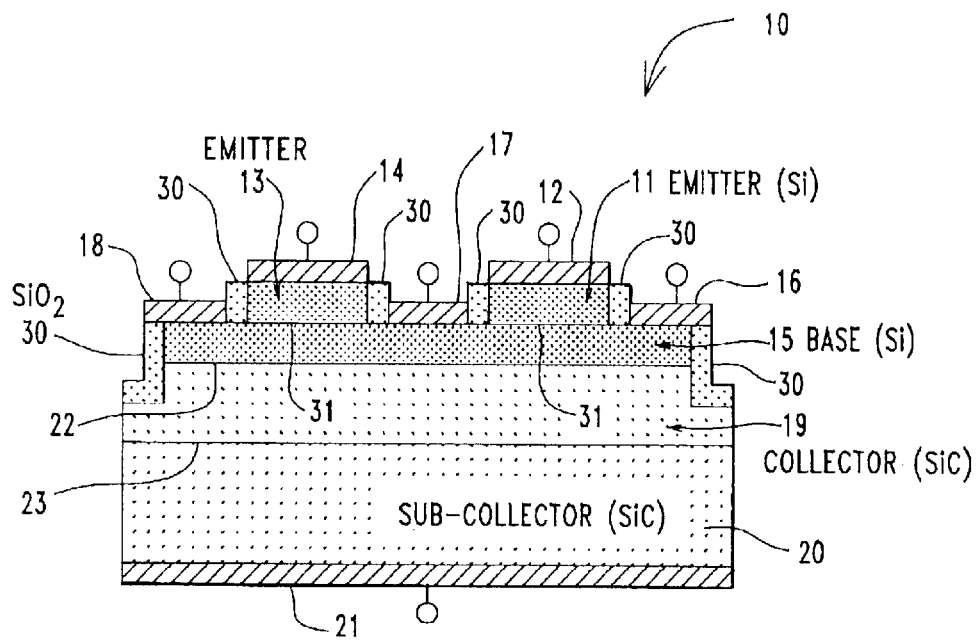
FIG. 1 is a cross sectional view of a SiC-based HBT in accordance with the invention.

A bipolar transistor includes three distinct semiconductor regions, respectively called an emitter region, a base region and a collector region. A cross-sectional schematic of a two-finger SiC-based HBT 10 in accordance with the present invention is shown in FIG. 1. More generically, HBT 10 (which has two emitter elements and three base elements) has one or more emitter elements and one or more base elements.

HBT 10 includes (1) a first Si n-type emitter layer 11 and its contact layer 12, (2). a second Si n-type emitter layer 13 and its contact layer 14, (3) a p-type Si base layer 15 and its three contact layers 16, 17, and 18, (4) an n-type SiC collector layer 19, and (5) a n-type SiC sub-collector layer 20 having a contact layer 21, wherein sub-collector layer 20 may be more heavily doped than collector layer 19, thus improving the ohmic contact to the collector layer 19.

In the above arrangement, the contact layers to the Si layers may be either poly-Si, contact metals such as Aluminum or tungsten, or a metal silicide.

In operation, HBT 10 is a three-terminal device wherein contact layer 21 provides the device's collector-terminal, the three contact layers 16, 17 and 18 are electrically connected together to form the device's base-terminal, and the two contact layers 12 and 14 are electrically connected together to form the device's emitter-terminal. In the case of an N-finger HBT 10, the number N of emitter contact layers are electrically connected together to form the device's emitter-terminal, and the base contact layers are electrically connected together to form the device's base-terminal.

HBT 10 includes a first interface 31 between emitters 11/13 and base 15, a second interface 22 between base 15 and collector 19, and a third interface 23 between collector 19 and sub-collector 20. In accordance with a feature of the invention, at least one, two, or all three of the interfaces 31, 22 and 23 is a direct-wafer-bonded interface.

For example, emitter-to-base interface 31 may be either a grown interface, an implanted or a diffused interface, whereas both base-to-collector interface 22 and collector-to-sub-collector interface 23 may be direct-wafer-bonded-interfaces.

Within the spirit and scope of this invention there are many variations and combinations of techniques well known to semiconductor device specialists that can be applied in order to fabricate devices as above-described.

As the term is used herein, direct-wafer-bonding is intended to mean a process whereby two smooth and flat surfaces are brought together, in physical contact, in the absence of an intermediate layer or film, and usually with the application of a uniaxial pressure, such that the two flat surfaces are locally attracted to each other by Van der Walls forces, so that the two flat surfaces stick or bond together. The crystallites in the two flat surfaces of a direct-wafer-bonded interface can fuse together at elevated temperatures due to the surface-energy-induced migration and crystal growth, or the formation of bonds, between the two surface species.

Prior to the direct-wafer-bonding, the two surfaces that are to be bonded are processed to produce surface characteristics that facilitate the direct-wafer-bonding of these two surfaces. The two mating surfaces are prepared for direct-wafer-bonding, as is well known to those skilled in the art. Generally, the two surfaces must be clean, they must be flat, and these two surfaces do not contain an intermediate material such as an oxide, such that direct-wafer-bonding can be achieved. Direct-wafer-bonding without the presence of an intermediate oxide layer also facilitates electrical conduction across the bonded interface.

HBT 10 can be made to provide n-p-n conductivity wherein emitters 11 and 13 are n-type Si, wherein base 15 is p-type Si, and wherein collector 19 and sub-collector 20 are n-type SiC, or HBT 10 can be made to provide p-n-p conductivity wherein emitters 11 and 13 are p-type Si, wherein base 15 is n-type Si, and wherein collector 19 and sub-collector 20 are p-type SiC.

The n-emitter/p-base/n-collector structure is preferred as this structure expected to have superior transport properties, due to a higher electron-mobility than hole-mobility in Si and SiC.

In an embodiment of the invention HBT 10 provided a base/collector direct-wafer-bonded heterojunction 22, thus differing from a conventional HBT which employs a grown emitter/base heterojunction.

Using Si within emitter regions 11 and 13 and within base region 15 of HBT 10, and using SiC in the collector region 19 and sub-collector region 20 of HBT 10, allows under normal operating conditions that a high electrical field resides within the SiC collector due to the SiC's high maximum electric field before breakdown. Efficient heat removal from SiC-based HBT 10 is assured due to the high thermal conductivity of the SiC.

Si base 15 of HBT 10 facilitates good base electron-transport due to the high electron-mobility that is provided by Si. Using Si as the base layer also results in a low base sheet resistance and a low resistivity ohmic p-type contact that base 22 makes with the contacts 16, 17 and 18. The critical p-type base layer should be doped above $10^{17}$ cm$^{-3}$ and the thickness should be less than 1 micrometer.

The emitter/base portion of HBT 10 can be fabricated using standard photolithography and etching (reactive ion etching and wet/or chemical etching). Passivation or protection of HBT 10 can be achieved using silicon oxide or silicon nitride, as is shown at 30.

Other HBT structures can be made by changing emitters 11/13 to a material that has a larger bandgap energy than that of the Si base layer 15, for example, but not limited to using SiC, amorphous-Si, amorphous-SiC, or diamond-like carbon for emitters 11,13. Such an HBT structure with two heterojunctions is sometimes called a double heterojunction bipolar transistor (DHBT), shown in FIG. 2.

Figure 2:
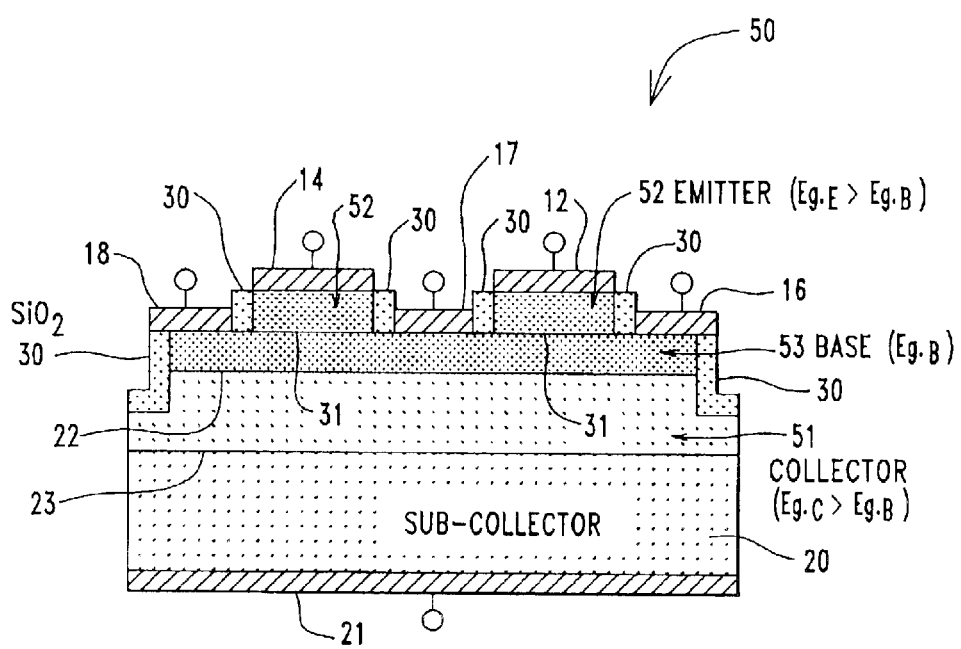
FIG. 2 is a cross section of a SiC-based double heterojunction bipolar transistor (DHBT) in accordance with the invention wherein the bandgap of the collector and the bandgap of the two emitters are larger than the bandgap of the base.

FIG. 2 is a cross section of a SiC-based DHBT 50 in accordance with the invention wherein the bandgap $E_{g,C}$ of collector layer 51 and the bandgap $E_{g,E}$ of emitter layer 52 is larger that the bandgap $E_{g,B}$ of base layer 53. It is also advantageous that the emitter-base heterojunction forms a Type I heterojunction as defined by Weisbuch and Vinter (Quantum Semiconductor Structures, Academic Press, London 1991, p. 3) to maximize the emitter injection efficiency.

The emitter 52, the base 53, the collector 51 and the sub-collector 20 of the FIG. 2 device can be constructed using the materials described relative to the FIG. 1 device.

Advantages of using DHBT 50, as opposed to using the HBT 10 structure above-described relative to FIG. 1, includes increased injection efficiency and increased gain of DHBT 50, while simultaneously maintaining good base-transport, low sheet resistance and good p-type base contact, all while keeping the high field within the SiC drift region.

When diamond-like carbon is used in emitters 11/13 of FIG. 1 the resulting heterojunction structure must be p-n-p, until such time as n-type diamond becomes available.

Emitters 11/13 of the FIG. 1 structure can be direct-wafer-bonded, grown or deposited prior to or after direct-wafer-bonding of the Si base 15 to the SiC collector 19. That is, interfaces 31 can also be direct-wafer-bonded interfaces.

FIG. 2's DHBT 50 can also involve using a SiGe alloy to form the base/emitter layers of an emitter/base heterojunction combination that is direct-wafer-bonded to SiC collector 51. The advantage of this FIG. 2 structure is similar to that above-described. SiGe is a binary semiconductor in which the bandgap depends upon the alloy composition.

In accordance with this invention the SiC collector can be increased in thickness beyond that which is possible by growth by direct-wafer-bonding two or more grown collector layers together to form a multi-layer collector.

Direct-wafer-bonding using both polarities of SiC (i.e. Si—Si and Si—C), and using Si wafers cut on or 3.5 degrees or 8 degrees off the (0001) axis is within the spirit and scope of this invention. Various SiC polytypes (4H, 6H, 3C, 15R . . . ) can also be used. The Sic should be of either (100) or (111) crystal orientation.

Surface morphology and surface preparation procedures at the above-described direct-wafer-bonded interfaces are important. It has been identified that the root-mean-squared surface roughness of such an interface should be better than about 10 Angstroms, as measured by atomic force microscopy. Such a surface roughness can be provided by polishing and in-situ hydrogen etching.

Growing a sacrificial silicon oxide ($SiO_2$) layer on a surface that is to be direct-wafer-bonded, and subsequently etching the silicon oxide layer off in hydrofluoric acid, improves the surface's morphology and protects the surface immediately prior to direct-wafer-bonding.

An issue to be considered when direct-wafer-bonding SiC to Si for vertical device structures is that both materials readily oxidize in air. This oxide needs to be removed. Thus it is preferred that the direct-wafer-bonding and any subsequent annealing step take place in an inert or a reducing atmosphere.

Standard preparation of surfaces to be direct-wafer-bonded includes the use of sacrificial oxides followed by solvent, RCA (for example see W. Kern, D. A. Puotinen, RCA Review, p. 187, June 1970), and electronic grade hydrofluoric acid cleaning.

Both hydrophilic and hydrophobic surfaces were used when direct-wafer-bonding as above-described.

Direct-wafer-bonding as above-described was performed using an all-graphite wafer bonder that provided chemical stability, uniform thermal expansion at high temperatures, and using a process whereby known and calibrated uniaxial pressures were applied.

In a non-limiting example of the invention, direct-wafer-bonding was accomplished by applying a pressure of up to about 600 psi and annealed for up to about 60 in at between 500 degrees C. and 1000 degrees C. in both inert (nitrogen and argon) and reducing (forming gases) atmospheres in order to solidify the direct-wafer-bond. When fabricating Ts using Si and SiGe it is important that the annealing temperature stay below 700 degrees C. to minimize dopant diffusion. Annealing at higher temperatures might be possible using rapid the at processing by reducing the annealing duration.

The following two heterojunction p-n diodes (1) a Si base and a 4H—SiC collector and (2) a Si base and a 6H—SiC collector, both in accordance with this invention, have been demonstrated and exhibit excellent current-voltage characteristics. (100) Si was bonded to Si-face, C-face, on-axis (4H and 6H), 3.5 degrees off (0001) (6H) and 8 degrees off (0001) (4H) SiC.

The invention has been described in detail while making reference to embodiments thereof However, since it is known that others, upon learning of this invention, will readily visualize yet other embodiments that are within the spirit and scope of this invention, this detailed description is not to be taken as a limitation on the spirit and scope of the invention.

What is claimed is:

1. A bipolar transistor comprising:
    a collector selected from one or more of the group SiC, (4H, 6H, 15R, 3C . . . );
    a base selected from one or more of the group Si, Ge and SiGe;
    an emitter selected from one or more of the group Si, SiGe, SiC, amorphous-Si, amorphous-SiC and diamond-like carbon; and
    a sub-collector selected from one or more of the group SiC, (4H, 6H, 15R, 3C . . . ).

2. The bipolar transistor of claim 1 wherein at east one of a first interface between said collector and said base and a second interface between said base and said emitter is a direct-wafer-bonded interface.

3. The bipolar transistor of claim 1 wherein at least one of a first interface between said collector and said base, a second interface between said base and said emitter, and a third interface between said collector and said sub-collector is a direct-wafer-bonded interface.

4. The bipolar transistor of claim 1 wherein said emitter is Si, said base is Si, and said collector is SiC.

5. The bipolar transistor of claim 4 wherein at least one of a first interface between said SiC collector and said Si base and a second interface between said Si base and said Si emitter is a direct-wafer-bonded interface.

6. The bipolar transistor of claim 1 wherein said sub-collector is SiC, said collector is SiC, and said base is Si and wherein at least one of a first interface between said SiC sub-collector and said SiC collector, a second interface between said SiC collector and said Si base, and a third interface between said Si base and said Si emitter is a direct-wafer-bonded interface.

7. The bipolar transistor of claim 1 wherein said emitter is Si, said base is Ge, and said collector is SiC.

8. The bipolar transistor of claim 7 wherein at least one of a first interface between said SiC collector and said Ge base and a second interface between said Ge base and said Si emitter is a direct-wafer-bonded interface.

9. The bipolar transistor of claim 1 wherein bandgap of said collector and a bandgap of said emitter are larger than a bandgap of said base.

10. The bipolar transistor of claim 9 wherein at least one of a first interface between said collector and said base and a second interface between said base and said emitter is a direct-wafer-bonded interface.

11. The bipolar transistor of claim 10 further including:
    a sub-collector selected from one or more of the group SiC and SiC polytypes (4H, 6H, 3C, 15R . . . ).

12. The bipolar transistor of claim 11 wherein at least one of a first interface between said collector and said base, a second interface between said base and said emitter, and a third interface between said collector and said sub-collector are a direct-wafer-bonded interface.

13. The bipolar transistor of claim 1 wherein said emitter is SiGe, said base is SiGe, and said collector is SiC.

14. The bipolar transistor of claim 13 wherein bandgap of said emitter is greater than a bandgap of said base.

15. A bipolar transistor comprising:
    a collector selected from the group SiC and SiC polytypes (4H, 6H, 15R, 3C . . . ), said collector having a collector-surface;
    a base selected from the group Si, Ge and SiGe, said base having first base-surface engaging said collector-surface, and said base having a second base-surface;
    at least a first emitter selected from the group Si, SiGe, SiC, amorphous-Si, amorphous-SiC and diamond-like carbon engaging said second base-surface: and
    at least a second emitter selected from the group Si, SiGe, SiC, amorphous-Si, amorphous-SiC and diamond-like carbon, said second emitter being space from said at least a first emitter, and said at least a second emitter engaging said second base-surface.

16. The bipolar transistor of claim 15 wherein at least one of a first interface between said collector-surface and said first base-surface, second interface between said second base-surface and said at least a first emitter, an a third interface between said second base-surface and said at least a second emitter is a direct-wafer-bonded interface.

17. The bipolar transistor of claim 15 wherein a bandgap of said collector, a bandgap of said at least a first emitter and a bandgap of said at least a second emitter are larger than a bandgap of said base.

18. The bipolar transistor of claim 17 wherein at least one of a first interface between said collector-surface and said first base-surface, a second interface between said second base-surface and said at least a first emitter, an a third interface between said second base-surface and said at least a second emitter is a direct-wafer-bonded interface.

19. A heterojunction comprising:
a first semiconductor layer selected from the group Si and $Si_iGe_{1-x}$;
said first semiconductor layer having a top surface and a bottom surface;
a first SiC layer;
said first SiC layer having a top surface and a bottom surface;
a direct-wafer-bonded interface between said bottom surface of said first semiconductor layer and said top surface of said SiC layer;
a Si layer;
said Si layer having a top surface and a bottom surface;
a direct-wafer-bonded interface between said top surface of said first semiconductor layer and said bottom surface of said Si layer;
a second SiC layer;
said second SiC layer having a top surface and a bottom surface; and
a direct-wafer-bonded interface between said bottom surface of said first SiC layer and said top surface of said second SiC layer.

20. A bipolar transistor comprising:
a collector selected from one or more of the group SiC, (4H, 6H, 15R, 3C . . . );
a base selected from one or more of the group Si, Ge and SiGe;
an emitter selected from one or more of the group Si, SiGe, SiC, amorphous-Si, amorphous-SiC and diamond-like carbon; and
a SiC sub-collector.

21. The bipolar transistor of claim 20 wherein the collector is SiC, the base is Si, and the emitter is Si and wherein at least one of a first interface between said SiC sub-collector and said SiC collector, a second interface between said SiC collector and said Si base, and a third interface between said Si base and said Si emitter is a direct-wafer-bonded interface.

22. A bipolar transistor comprising:
a SiC collector;
a Ge base; and
an Si emitter.

23. The bipolar transistor of claim 22 wherein at least one of a first interface between said SiC collector and said Ge base and a second interface between said Ge base and said Si emitter is a direct-wafer-bonded interface.

24. The bipolar transistor of claim 23 further including: a SiC sub-collector.

25. A bipolar transistor comprising:
a SiC collector;
a base selected from one or more of the group Ge and SiGe; and
an emitter selected from one or more of the group Si, SiGe, SiC, amorphous-Si, amorphous-SiC, and diamond-like carbon.

26. The bipolar transistor of claim 25 wherein at least one of a first interface between said SiC collector and said base and a second interface between said base and said emitter is a direct-wafer-bonded interface and wherein the base comprises Si.

27. The bipolar transistor of claim 25 further including: a SiC sub-collector.

28. The bipolar transistor of claim 27 wherein at least one of a first interface between said SiC sub-collector and said SiC collector, a second interface between said SiC collector and said base, and a third interface between said base and said emitter is a direct-wafer-bonded interface.

29. The bipolar transistor of claim 25 wherein the base comprises Ge.

30. A bipolar transistor comprising:
a SiC collector;
a base selected from one or more of the group Si, Ge and SiGe; and
an emitter selected from one or more of the group SiGe, amorphous-Si, amorphous-SiC, and diamond-like carbon.

31. The bipolar transistor of claim 30 wherein at least one of a first interface between said SiC collector and said base and a second interface between said base and said emitter is a direct-wafer-bonded interface and wherein the base comprises Si.

32. The bipolar transistor of claim 30 further including: a SiC sub-collector.

33. The bipolar transistor of claim 32 wherein at least one of a first interface between said SiC sub-collector and said SiC collector, a second interface between said SiC collector and said base, and a third interface between said base and said emitter is a direct-wafer-bonded interface.

34. The bipolar transistor of claim 30 wherein the bas comprises Ge.

35. The bipolar transistor of claim 30 wherein the emitter comprises Si.

36. The bipolar transistor of claim 30 wherein the emitter is SiGe.

37. The bipolar transistor of claim 30 wherein the emitter comprises carbon.

38. The bipolar transistor of claim 30 wherein the base is positioned between the emitter and the collector.

39. The bipolar transistor of claim 30 wherein the emitter is amorphous-SiC.

40. The bipolar transistor of claim 30 wherein the emitter is diamond-like carbon.

41. A bipolar transistor comprising:
a collector selected from one or more of the group SiC, (4H, 6H, 15R, 3C . . . );
a base selected from one or more of the group Si, Ge and SiGe;
an emitter selected from one or more of the group Si, SiGe, SiC, amorphous-Si, amorphous-SiC and diamond-like carbon, wherein a bandgap of said collector and a bandgap of said emitter are larger than a bandgap of said base and wherein at least one of a first interface between said collector and said base and a second interface between said base and said emitter is a direct-wafer-bonded interface; and
a sub-collector selected from one or more of the group SiC and SiC polytypes (4H, 6H, 3C, 15R . . . ).

42. The bipolar transistor of claim 41 wherein at least one of a first interface between said collector and said base, a second interface between said base and said emitter, and a third interface between said collector and said sub-collector are a direct-wafer-bonded interface.

43. A bipolar transistor comprising:
a SiC collector;
an SiGe base; and
an SiGe emitter.

44. The bipolar transistor of claim 43 wherein a bandgap of said emitter is greater than a bandgap of said base.

* * * * *